(12) United States Patent
Shiue et al.

(10) Patent No.: US 9,118,097 B2
(45) Date of Patent: Aug. 25, 2015

(54) DIFFERENTIAL MODE TRANSMISSION LINES WITH WEAK COUPLING STRUCTURE

(75) Inventors: Guang-Hwa Shiue, Zhongli (TW); Che-Ming Hsu, Zhongli (TW)

(73) Assignee: CHUNG YUAN CHRISTIAN UNIVERSITY, Zhongli (TW)

( * ) Notice: Subject to any disclaimer, the term of this patent is extended or adjusted under 35 U.S.C. 154(b) by 442 days.

(21) Appl. No.: 13/303,013

(22) Filed: Nov. 22, 2011

(65) Prior Publication Data

US 2013/0049878 A1    Feb. 28, 2013

(30) Foreign Application Priority Data

Aug. 31, 2011 (TW) .............................. 100131380 A (51) Int. Cl.
- H05K 1/02 (2006.01)
- H01P 3/08 (2006.01)
- H01P 3/02 (2006.01)

(52) U.S. Cl.
CPC ........ H01P 3/08 (2013.01); H01P 3/026 (2013.01); H05K 1/025 (2013.01); H05K 1/0245 (2013.01)

(58) Field of Classification Search
CPC ............. H01P 3/02; H01P 3/026; H01P 3/04; H01P 3/081; H01P 5/022; H05K 1/0245; H05K 1/025

USPC .................................. 333/1, 4, 5, 33, 238, 34
See application file for complete search history.

(56) References Cited

U.S. PATENT DOCUMENTS

| | | | | |
|---|---|---|---|---|
| 6,812,803 B2 * | 11/2004 | Goergen | ............................ | 333/1 |
| 2010/0232480 A1 * | 9/2010 | Bhandal et al. | ................ | 375/219 |
| 2012/0007688 A1 * | 1/2012 | Zhou et al. | ......................... | 333/4 |

* cited by examiner

Primary Examiner — Benny Lee
(74) Attorney, Agent, or Firm — Maschoff Brennan (57) ABSTRACT

A differential mode transmission line with a weak coupling structure is presented. The differential mode transmission line with a weak coupling structure includes a first transmission line and a second transmission line. The first transmission line includes a first wiring portion, a second wiring portion, and a third wiring portion. The second transmission line also includes a first wiring portion, a second wiring portion, and a third wiring portion. The wiring portions of the present disclosure are connected through connection portions, and the connection portions are designed as a corner structure. Due to the characteristics of the corner structure of the present disclosure, a pitch between the second wiring portions is greater than that between the first wiring portions or the third wiring portions, thereby generating a weak coupling structure to suppress common mode noises.

11 Claims, 7 Drawing Sheets

DIFFERENTIAL MODE TRANSMISSION LINES WITH WEAK COUPLING STRUCTURE

CROSS-REFERENCE TO RELATED APPLICATIONS

This non-provisional application claims priority under 35 U.S.C. §119(a) on Patent Application No(s). 100131380 filed in Taiwan, R.O.C. on Aug. 31, 2011, the entire contents of which are hereby incorporated by reference.

BACKGROUND

1. Technical Field

The present disclosure relates to differential mode transmission lines, and more particularly to differential mode transmission lines with a weak coupling structure.

2. Related Art

With increasing demands for electronic equipment, portable electronic devices with high transmission speed are developed. However, while these demands are met, many unexpected cases occur concurrently. Taking Printed Circuit Boards (PCBs) for example, with the increasing of the frequency of the signal transmission, electromagnetic waves are likely to be emitted outwards, resulting in the so-called electromagnetic interference (EMI). The EMI is not only harmful to the human body, but also may makes the PCBs fail to meet the required safety standards.

Accordingly, because differential mode transmission lines are resistant to the EMI and not easily be affected by grounding voltage disturbances, the differential mode transmission lines are widely used. However, in order to layout a complex circuit in a limited PCB space, the differential mode transmission lines must have many corners. Due to those corners, the lengths of the differential mode transmission lines are unequal, resulting common mode noises. Descriptions are given below with reference to the drawings.

Figure 1:
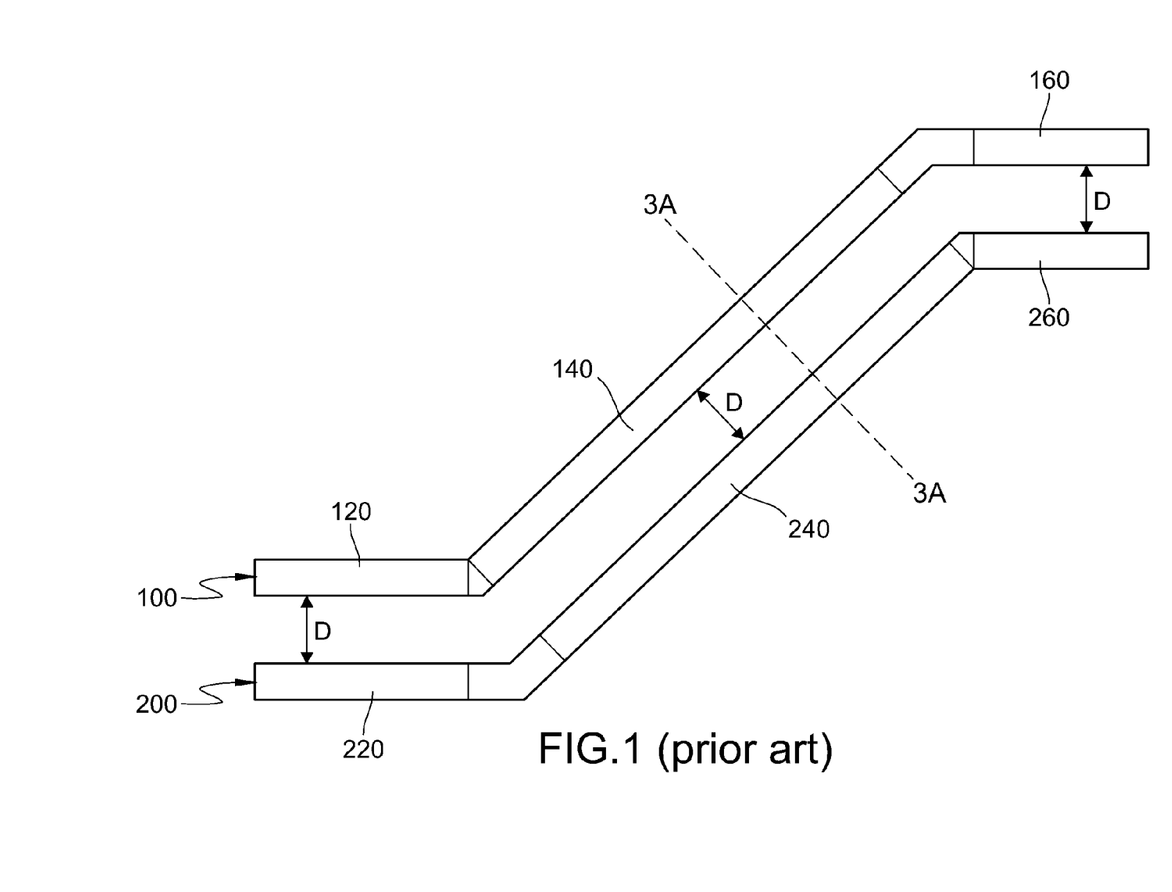
FIG. 1 is a differential mode transmission line in the prior art.

FIG. 1 is a schematic view of a conventional differential mode transmission line. The conventional differential mode transmission lines include a first transmission line 100 and a second transmission line 200. The first transmission line 100 includes a first wiring portion 120, a second wiring portion 140, and a third wiring portion 160. The second transmission line 200 includes a first wiring portion 220, a second wiring portion 240, and a third wiring portion 260. Furthermore, the first transmission line and the second transmission line define a first pitch D. That is, distance between the first transmission line and the second transmission line remains the same.

In the structure shown in FIG. 1, a corner exists between the first wiring portion 120 and the second wiring portion 140 of the first transmission line 100. Similarly, a corner exists between the second wiring portion 140 and the third wiring portion 160. The second transmission line 200 has similar structures. Due to those corners, the lengths of the transmission lines are unequal to each other. It can be seen from FIG. 1, since those turns of the conventional differential mode transmission lines cause difference in length due to the geometrical structure, common mode noises are generated while signals are transmitted in those transmission lines. Furthermore, at an uncompensated segment (that is, the second wiring portion of the preceding transmission line), because the transmission rates of the common mode noises are different from those of the signals, the common mode noises generated at the corners cannot be eliminated at the next turning site, thereby resulting in the EMI, which may make the product fail to meet the safety standards.

SUMMARY OF THE INVENTION

Accordingly, the present disclosure relates differential mode transmission lines with a weak coupling structure for solving the problem of common mode noises in the prior art.

In one embodiment, the differential mode transmission lines with a weak coupling structure comprise a first transmission line and a second transmission line. The first transmission line of the first transmission line comprises a first wiring portion, a second wiring portion, a third wiring portion, a first connection portion, and a second connection portion. The first connection portion of the first transmission line is connected to the first wiring portion of the first transmission line and the second wiring portion of the first transmission line, and the second connection portion of the first transmission line is connected to the second wiring portion of the first transmission line and the third wiring portion of the first transmission line.

The second transmission line comprises a first wiring portion, a second wiring portion, a third wiring portion, a first connection portion, and a second connection portion. The first connection portion of the second transmission line is connected to the first wiring portion of the second transmission line and the second wiring portion of the second transmission line, and the second connection portion of the second transmission line is connected to the second wiring portion of the second transmission line and the third wiring portion of the second transmission line. Furthermore, the pitch between the first wiring portion of the first transmission line and the first wiring portion of the second transmission line is defined as a first pitch, the pitch between the second wiring portion of the first transmission line and the second wiring portion of the second transmission line is defined as a second pitch, the pitch between the third wiring portion of the first transmission line and the third wiring portion of the second transmission line is defined as a third pitch, and the second pitch is greater than the first pitch and the third pitch.

According to the differential mode transmission lines with the weak coupling structure, through the design of the corner structure, the pitch between uncompensated line segments of the two wires is greater than that of none-uncompensated line segments, such that the coupling coefficient of the weak coupling structure formed by the uncompensated line segments is low. Accordingly, common mode noises are eliminated. By arranging the uncompensated line segments as a weak coupling structure, the transmission-rate difference between the differential mode noises and signals transmitted in the transmission lines is decreased, such that the common mode noises generated at a first corner is reduced at a second corner as much as possible. It should be noted that corner referred to herein is the connection portion defined in the embodiments.

BRIEF DESCRIPTION OF THE DRAWINGS

The present disclosure will become more fully understood from the detailed description given herein below for illustration only, and thus are not limitative of the present disclosure, and wherein.

DETAILED DESCRIPTION OF THE INVENTION

The detailed features and advantages of the present disclosure are described below in great detail through the following embodiments, and the content of the detailed description is sufficient for persons skilled in the art to understand the technical content of the present disclosure and to implement the present disclosure there accordingly. Based upon the content of the specification, the claims, and the drawings, persons skilled in the art can easily understand the relevant objectives and advantages of the present disclosure. The following embodiments are intended to describe the present disclosure in further detail, but not intended to limit the scope of the present disclosure in any way.

Figure 2:
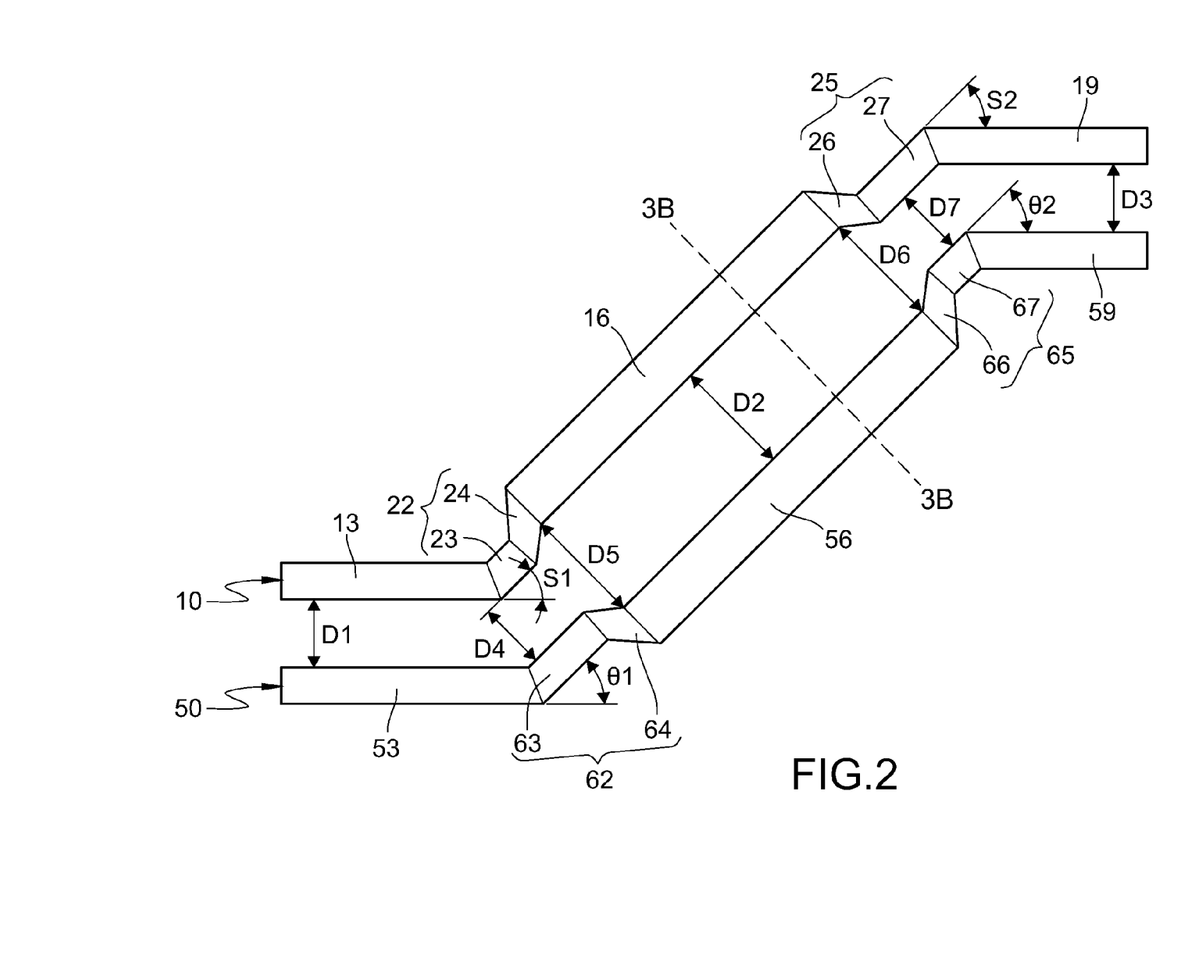
FIG. 2 is a differential mode transmission line with a weak coupling structure.

FIG. 2 is differential mode transmission lines with a weak coupling structure according to an embodiment of the present disclosure. The transmission lines mainly comprise a first transmission line 10 and a second transmission line 50. The first transmission line 10 comprises a first wiring portion 13, a second wiring portion 16, and a third wiring portion 19. In addition, the first transmission line 10 further comprises a first connection portion 22 and a second connection portion 25. The first connection portion 22 is connected to the first wiring portion 13 and the second wiring portion 16, and the second connection portion 25 is connected to the second wiring portion 16 and the third wiring portion 19. The second transmission line 50 comprises a first wiring portion 53, a second wiring portion 56, and a third wiring portion 59. In addition, the second transmission line 50 comprises a first connection portion 62 and a second connection portion 65. The first connection portion 62 is connected to the first wiring portion 53 and the second wiring portion 56, and the second connection portion 65 is connected to the second wiring portion 56 and the third wiring portion 59.

The first wiring portion 13 of the first transmission line 10 and the first wiring portion 53 of the second transmission line 50 define a first pitch D1; the second wiring portion 16 of the first transmission line 10 and the second wiring portion 56 of the second transmission line 50 define a second pitch D2; the third wiring portion 19 of the first transmission line 10 and the third wiring portion 59 of the second transmission line 50 define a third pitch D3, and the second pitch D2 is greater than each one of the first pitch D1 and the third pitch D3.

Referring to FIG. 2, in this embodiment, the first connection portion 22 of the first transmission line 10 comprises a first part 23 and a second part 24. The second connection portion 25 comprises a third part 26 and a fourth part 27. The first connection portion 62 of the second transmission line 50 comprises a first part 63 and a second part 64, and the second connection portion 65 comprises a third part 66 and a fourth part 67. A first end of the first part 23 of the first transmission line 10 is connected to the first wiring portion 13, and a second end of the first part 23 of the first transmission line 10 is connected to the second part 24. A first end of the second part 24 is connected to the first part 23, and a second end of the second part 24 is connected to the second wiring portion 16. A first end of the third part 26 is connected to the second wiring portion 16, and a second end of the third part 26 is connected to the fourth part 27. A first end of the fourth part 27 is connected to the third part 26, and a second end of the fourth part 27 is connected to the third wiring portion 19. A first end of the first part 63 of the second transmission line 50 is connected to the first wiring portion 53, and a second end of the first part 63 of the second transmission line 50 is connected to the second part 64. A first end of the second part 64 is connected to the first part 63, and a second end of the second part 64 is connected to the second wiring portion 56. A first end of the third part 66 is connected to the second wiring portion 56, and a second end of the third part 66 is connected to the fourth part 67. A first end of the fourth part 67 is connected to the third part 66, and a second end of the fourth part 67 is connected to the third wiring portion 59.

The pitch between the first part 23 of the first transmission line 10 and the first part 63 of the second transmission line 50 is a fourth pitch D4. The fourth pitch D4 is equal to the first pitch D1 and less than the second pitch D2. The pitch between the second part 24 of the first transmission line 10 and the second part 64 of the second transmission line 50 is a fifth pitch D5, and the fifth pitch D5 is a gradually increased from the fourth pitch D4 to the second pitch D2. The pitch between the third part 26 of the first transmission line 10 and the third part 66 of the second transmission line 50 is a sixth pitch D6, and the sixth pitch D6 is a gradually decreased from the second pitch D2 to a seventh pitch D7. A seventh pitch D7 is the pitch between the fourth part 27 of the first transmission line 10 and the fourth part 67 of the second transmission line 50, and the seventh pitch D7 is equal to the third pitch D3. In this embodiment, the length of the first transmission line 10 is equal to that of the second transmission line 50; the length of the first wiring portion 13 of the first transmission line 10 is less than that of the second wiring portion 53 of the second transmission line 50; the length of the second wiring portion 16 of the first transmission line 10 is equal to that of the second wiring portion 56 of the second transmission line 50, and the length of third wiring portion 19 of the first transmission line 10 is greater than that of the third wiring portion 59 of the second transmission line 50.

In this embodiment and some embodiments, the width of the first wiring part 13 and the third wiring portion 19 of the first transmission line 10 are each less than that of the second wiring portion 16. The width of the first wiring part 53 and the third wiring portion 59 of the second transmission line 50 are each less than that of the second wiring portion 56. The width of the first part 23 of the first transmission line 10 is equal to that of the first wiring portion 13 and less than that of the second wiring portion 16. The width of the second part 24 is gradually increased from the width of the first part 23 to that of the second wiring portion 16. The width of the fourth part 27 is equal to that of the third wiring portion 19 and such a width is less than that of the second wiring portion 16. The width of the third part 26 is gradually decreased from the width of the second wiring portion 16 to that of the fourth wiring portion 27; and the width of the first part 63 of the second transmission line 50 is equal to that of the first wiring line 53 and such a width is less than the that of the second wiring portion 56. The width of the second part 64 is gradually increased from the width of the first part 63 to that of the second wiring portion 56; and the width of the fourth part 67 is equal to that of the third wiring portion 59 and such a width is less than that of the second wiring portion 56. The width of the third part 66 is gradually decreased from the width of the second wiring portion 56 to that of the fourth part 67.

Referring to FIG. 2, in this embodiment, a first angle S1 is formed between the first part 23 of the transmission line 10 and the first wiring portion 13, and a second angle S2 is formed between the fourth part 27 and the third wiring portion 19. A first angle θ1 is formed between the first part 62 of the second transmission line 50 and the first wiring portion 53, and a second angle θ2 is formed between the fourth part 67 and the third wiring portion 59. The first wiring portion 13 of the first transmission line 10 is parallel to the first wiring portion 53 of the second transmission line 50, the second wiring portion 16 of the first transmission line 10 is parallel to the second wiring portion 56 of the second transmission line 50, and the third wiring portion 19 of the first transmission line 10 is parallel to the third wiring portion 59 of the second transmission line 50. The first part 23 of the first transmission line 10 is parallel to the first part 63 of the second transmission line 50, and the fourth part 27 of the first transmission line 10 is parallel to the fourth part 67 of the second transmission line 50. A length of the first part 23 of the first transmission line 10 is less than that of the first part 63 of the second transmission line 50, and a length of the fourth part 27 of the first transmission line 10 is greater than that of the fourth part 67 of the second transmission line 50.

Although the composition of the transmission line is described based on detailed components thereof, but in fact, the components are fabricated integrally, and alternately, they may also be fabricated separately. Therefore, when mentioned, those components may be regarded as portions of a single piece of element or independent parts assembled together.

Through the design of the corner structure of the connection, the pitch between the two transmission lines in the uncompensated line segment is greater than that in the compensated line segment, such that the coupling coefficient of the uncompensated line segments is less than that of the compensated line segments, and thus a weak coupling structure is formed. Due to the weak coupling structure, the difference between the transmission rates of the differential mode noises and the signals transmitted in the transmission lines of the above embodiment is less than that of the conventional differential mode transmission line, such that common mode noises generated at the first corner are reduced at the second corner as much as possible. Accordingly, the common mode noises can be suppressed effectively.

In the implementation of the present disclosure, the transmission lines can be formed on a PCB through electroplating or deposition. Alternatively, the transmission lines may also be formed by attaching metal straps such as copper-foil straps to the PCB. Therefore, if required, the architecture can be applied to reduce common mode noises of the transmission line in circuit design or circuit layout.

Figure 3A:
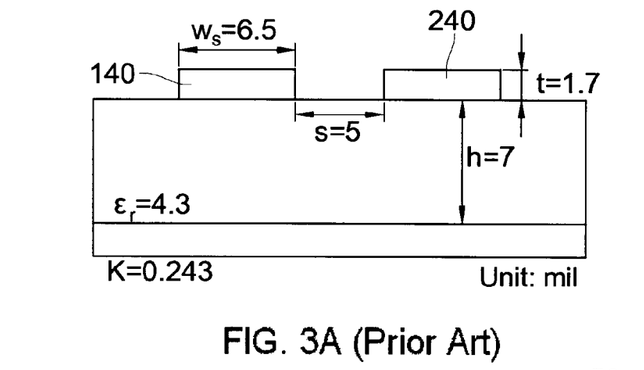
FIG. 3A is a sectional view of the differential mode transmission line in the prior art.
Figure 3B:
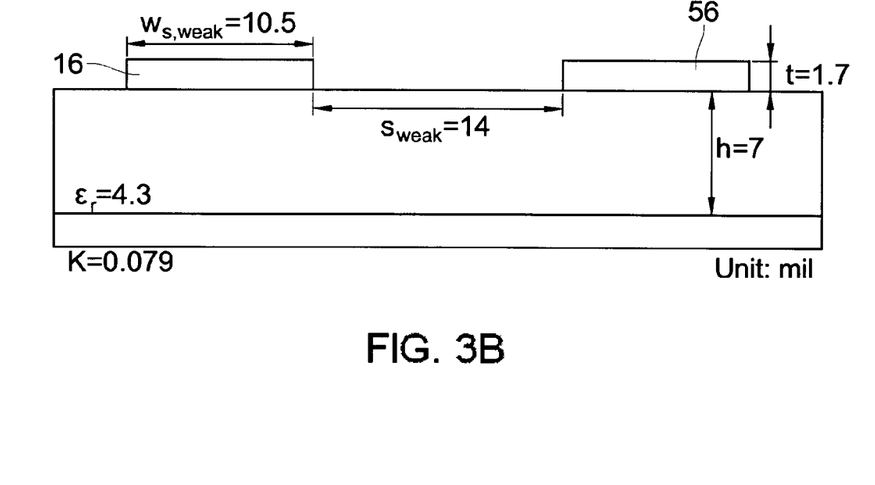
FIG. 3B is a sectional view of the differential mode transmission line with a weak coupling structure.
Figure 4:
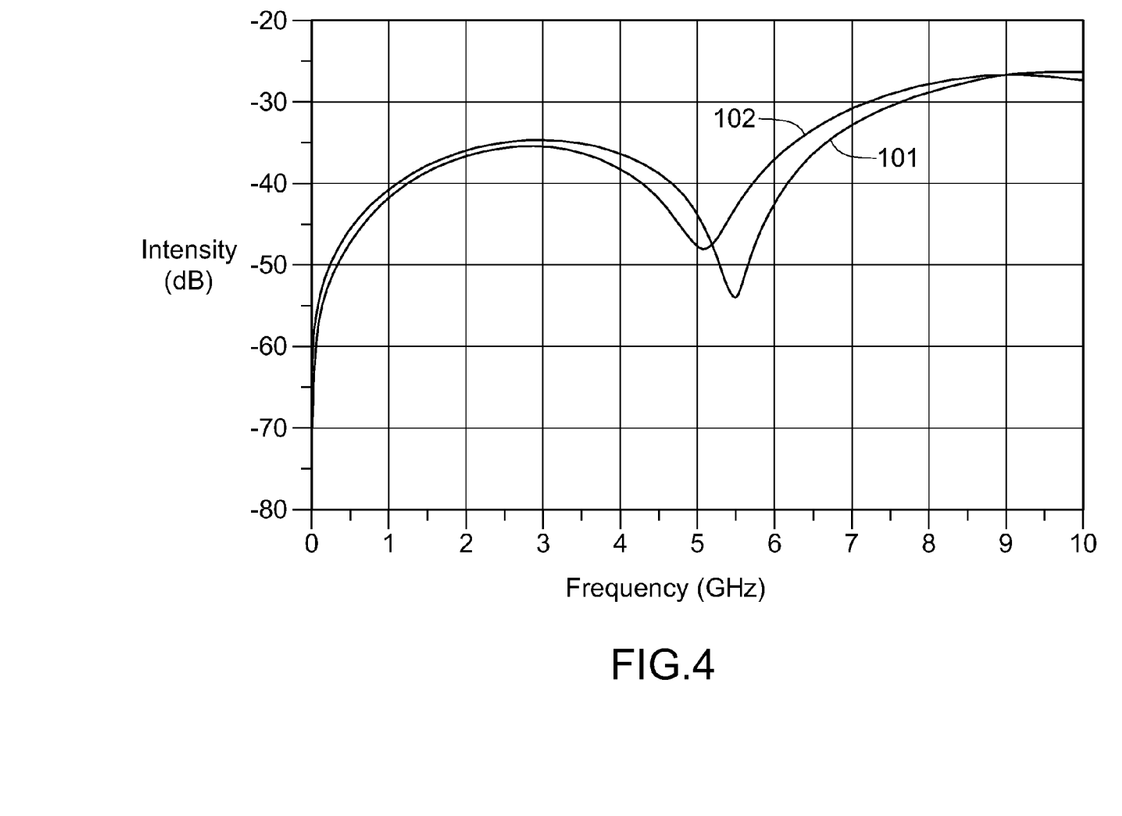
FIG. 4 is an intensity-frequency diagram illustrating reflection loss curves.
Figure 5:
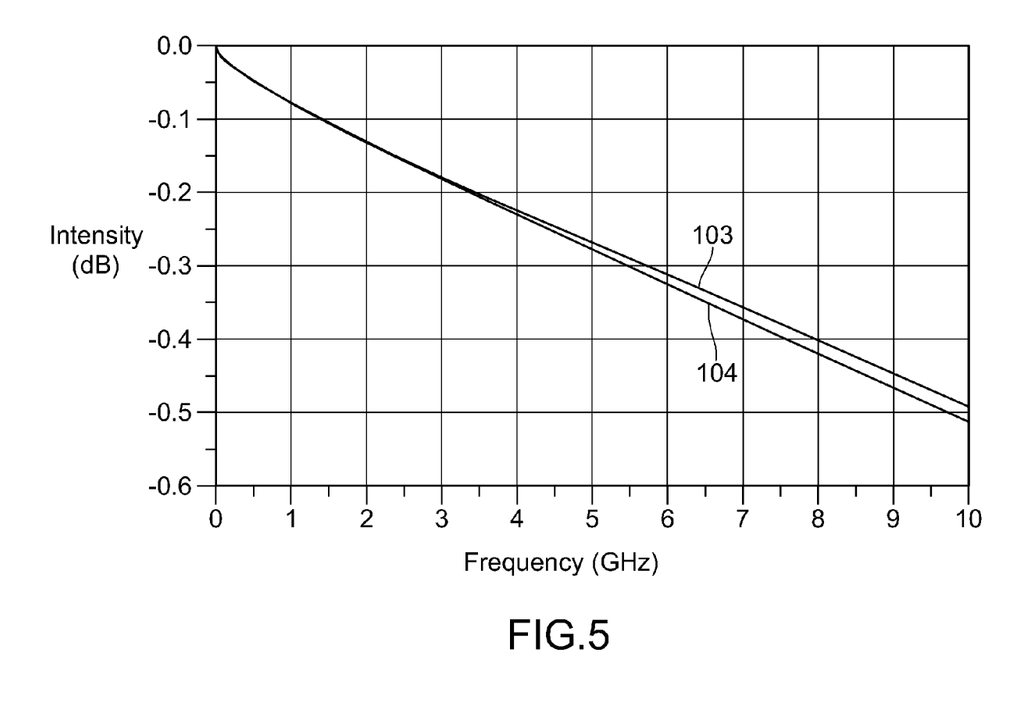
FIG. 5 is an intensity-frequency diagram illustrating insertion loss curves.
Figure 6:
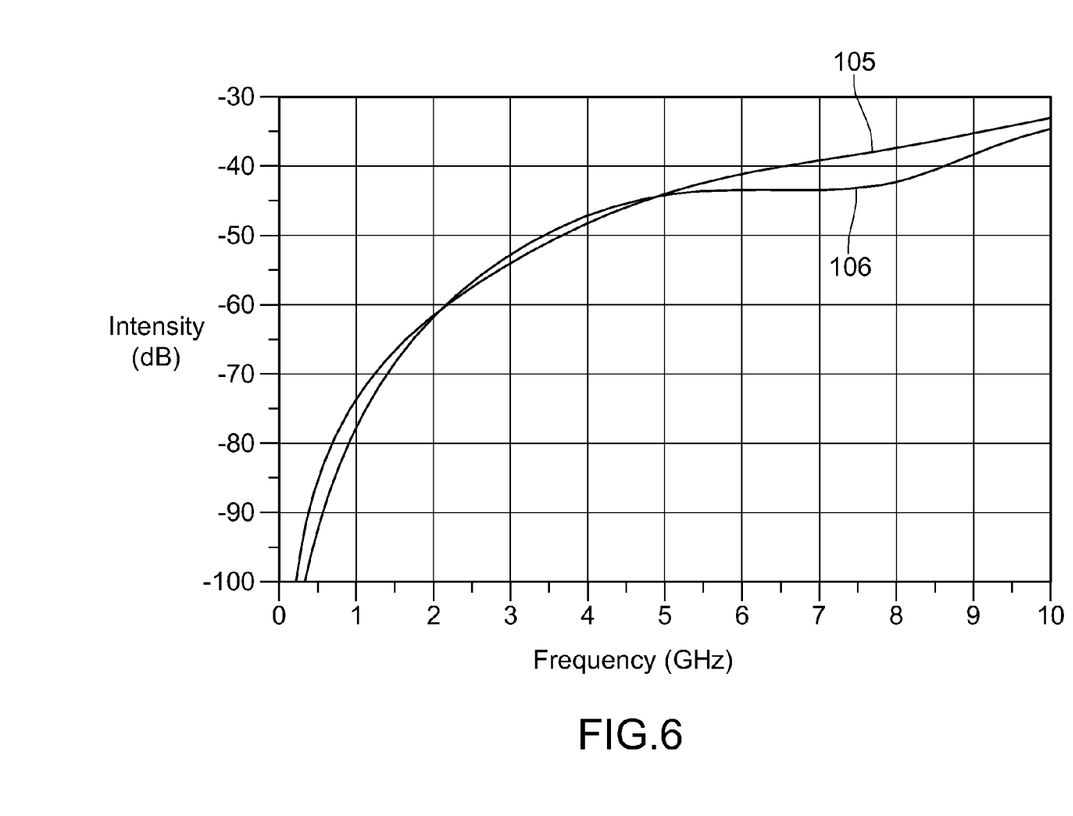
FIG. 6 is an intensity-frequency diagram illustrating differential to common mode curves.

Actual simulation diagrams according to the structure of the present disclosure are shown in the following. FIG. 3A and FIG. 3B respectively show the cross-sectional views along section lines 3A-3A and 3B-3B, respectively, of the transmission lines of FIG. 1 and FIG. 2 which are adhered to PCBs. The dielectric constant $\in_r$ of the PCB is 4.3, and the height h of the PCB is 7 mils. The height t of each transmission line is 1.7 mils. It can be seen from FIG. 3A, when the pitch s between the second wiring portion 140 of the first transmission line 100 and the second wiring portion 240 of the second transmission line 200 is 5 mils, and the width $W_S$ of the transmission line is 6.5 mils, the coupling coefficient K is 0.243, and thus a strong coupling is formed. In FIG. 3B, when the pitch $s_{weak}$ between the second wiring portion 16 of the first transmission line 10 and the second wiring portion 56 of the second transmission line 50 is 14 mils, and the width $W_{s,weak}$ of the transmission line is 10.5 mils, the coupling coefficient K is 0.079, and thus a weak coupling is formed. FIGS. 4-6 are intensity-frequency diagrams.

Figure 7:
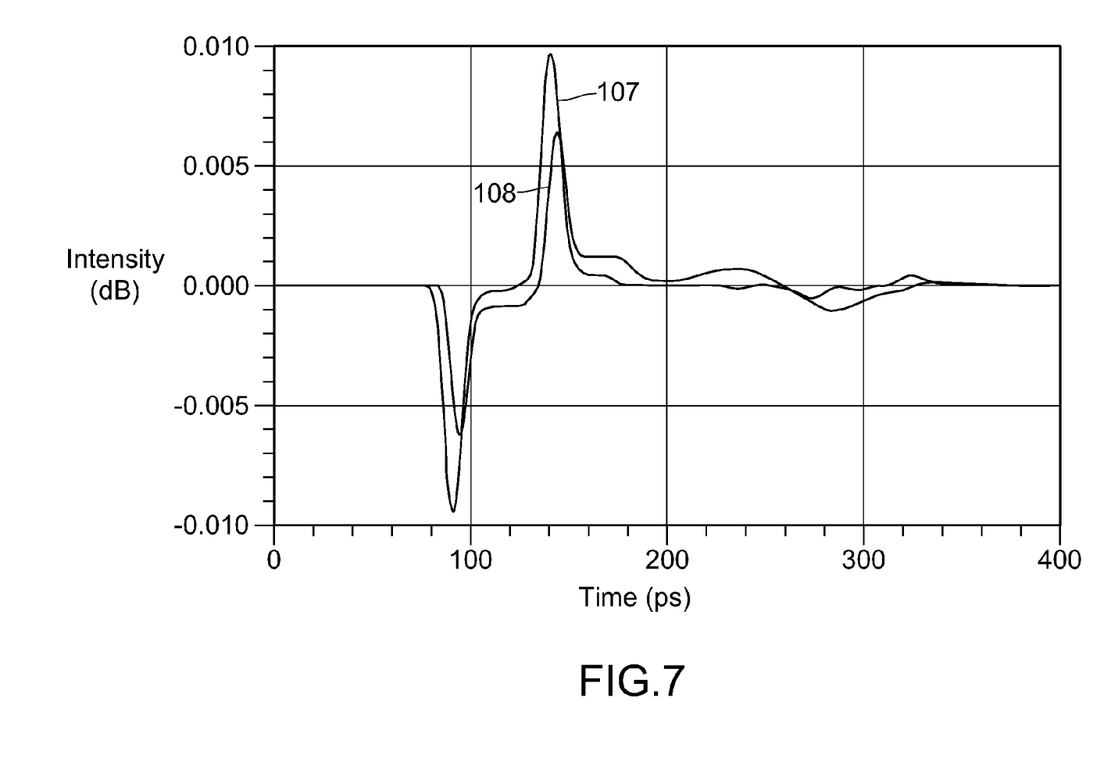
FIG. 7 is time domain comparison curves of common mode noise of the differential mode transmission line in the prior art and the differential mode transmission line with a weak coupling structure.

In the FIGS. 4-6, the horizontal axes are related to frequency (GHz) and the vertical axes are related to intensities (dB). FIG. 7 is an intensity-time diagram, where the horizontal axis is related to time (ps) and the vertical axis is related to intensity (dB). FIG. 4 is reflection loss curves of the differential mode transmission lines in the prior art and the differential mode transmission lines with the weak coupling structure, wherein the numeral 101 indicates the reflection loss curve of the transmission lines in the prior art and the numeral 102 indicates the reflection loss curve of the transmission lines with the weak coupling structure. It can be known from FIG. 4, due to the weak coupling structure, reflection noises have no serious effect on the transmission lines with the weak coupling structure. FIG. 5 is insertion loss curves of the differential mode transmission lines in the prior art and the differential mode transmission lines with the weak coupling structure, wherein the numeral 103 indicates the insertion loss curve of the transmission lines in the prior art and the numeral 104 indicates the insertion loss curve of the transmission lines with the weak coupling structure. It can be seen from FIG. 5, due to the weak coupling structure, the differential mode transmission lines with the weak coupling structure has an effect of 0.02 dB merely within 10 GHz. FIG. 6 is differential-to-common conversion curves of a differential mode transmission line in the prior art and a differential mode transmission line with a weak coupling structure, wherein the numeral 105 indicates the differential-to-common conversion curve of the transmission lines in the prior art and the numeral 106 indicates the differential-to-common conversion curve of the transmission lines with the weak coupling structure. It can be seen from FIG. 6, most of the common mode noises generated by the differential mode transmission lines with the weak coupling structure is less than that generated by the conventional differential mode transmission lines. FIG. 7 is common mode noise curves of the differential mode transmission lines in the prior art and the differential mode transmission lines with the weak coupling structure, wherein the numeral 107 indicates the common mode noise curve of the transmission lines in the prior art and the numeral 108 indicates the common mode noise of the transmission lines with the weak coupling structure. It can be seen from FIG. 7, the differential mode transmission lines with the weak coupling structure can decrease the voltage value of the common mode noises by 40%, such that the radiation generated by the common modes is decreased significantly and therefore, the EMI is reduced and the products is more likely to meet the safety standards.

In conclusion, through the design of the weak coupling structure of the present disclosure, the uncompensated line segment of the differential mode transmission line with the weak coupling structure has a lower coupling coefficient, such that the common mode noises can be suppressed effectively, thereby reducing the EMI.

What is claimed is:
1. A differential mode transmission line with a weak coupling structure, comprising:
a first transmission line, comprising a first wiring portion, a second wiring portion, a third wiring portion, a first connection portion, and a second connection portion, the first connection portion connected to the first wiring portion and the second wiring portion, and the second connection portion connected to the second wiring portion and the third wiring portion; and a second transmission line, comprising a first wiring portion, a second wiring portion, a third wiring portion, a first connection portion, and a second connection portion, the first connection portion connected to the first wiring portion and the second wiring portion, and the second connection portion connected to the second wiring portion and the third wiring portion;

wherein the first wiring portion of the first transmission line and the first wiring portion of the second transmission line define a first pitch, the second wiring portion of the first transmission line and the second wiring portion of the second transmission line define a second pitch, the third wiring portion of the first transmission line and the third wiring portion of the second transmission line define a third pitch, and the second pitch is greater than each one of the first pitch and the third pitch;

wherein the first connection portion of the first transmission line comprises a first part and a second part, the second connection portion of the first transmission line comprises a third part and a fourth part, a first end of the first part of the first connection portion of the first transmission line is connected to the first wiring portion of the first transmission line, a second end of the first part of the first connection portion of the first transmission line is connected to a first end of the second part of the first connection portion of the first transmission line, a second end of the second part of the first connection portion of the first transmission line is connected to the second wiring portion of the first transmission line, a first end of the third part of the second connection portion of the first transmission line is connected to the second wiring portion of the first transmission line, a second end of the third part of the second connection portion of the first transmission line is connected to a first end of the fourth part of the second connection portion of the first transmission line, and a second end of the fourth part of the second connection portion of the first transmission line is connected to the third wiring portion of the first transmission.

2. The differential mode transmission line with the weak coupling structure according to claim 1, wherein a width of the first wiring portion of the first transmission line and a width of the third wiring portion of the first transmission line are both less than a width of the second wiring portion of the first transmission line, a width of the first part of the first connection portion of the first transmission line is equal to the width of the first wiring portion of the first transmission line and less than the width of the second wiring portion of the first transmission line, a width of the second part of the first connection portion of the first transmission line is gradually increased from the width of the first part of the first connection portion of the first transmission line to the width of the second wiring portion of the first transmission line, a width of the fourth part of the second connection portion of the first transmission line is equal to the width of the third wiring portion of the first transmission line and less than the width of the second wiring portion of the first transmission line, and a width of the third part of the second connection portion of the first transmission line is gradually decreased from the width of the second wiring portion of the first transmission line to the width of the fourth part of the second connection portion of the first transmission line.

3. The differential mode transmission line with the weak coupling structure according to claim 2, wherein the first connection portion of the second transmission line comprises a first part and a second part, the second connection portion of the second transmission line comprises a third part and a fourth part, a first end of the first part of the first connection portion of the second transmission line is connected to the first wiring portion of the second transmission line, a second end of the first part of the first connection portion of the second transmission line is connected to the second part of the first connection portion of the second transmission line, a first end of the second part of the first connection portion of the second transmission line is connected to the first part of the first connection portion of the second transmission line, a second end of the second part of the first connection portion of the second transmission line is connected to the second wiring portion of the second transmission line, a first end of the third part of the second connection portion of the second transmission line is connected to the second wiring portion of the second transmission line, a second end of the third part of the second connection portion of the second transmission line is connected to the fourth part of the second connection portion of the second transmission line, a first end of the fourth part of the second connection portion of the second transmission line is connected to the third part of the second connection portion of the second transmission line, and a second end of the fourth part of the second connection portion of the second transmission line is connected to the third wiring portion of the second transmission line.

4. The transmission line with weak coupling structure according to claim 3, wherein a width of the first wiring portion of the second transmission line and a width of the third wiring portion of the second transmission line are both less than a width of the second wiring portion of the second transmission line, a width of the first part of the first connection portion of the second transmission line is equal to the width of the first wiring portion of the second transmission line and less than the width of the second wiring portion of the second transmission line, a width of the second part of the first connection portion of the second transmission line is gradually increased from a width of the first part of the first connection portion of the second transmission line to the width of the second wiring portion of the second transmission line, a width of the fourth part of the second connection portion of the second transmission line is equal to the width of the third wiring portion of the second transmission line and less than a width of the second wiring portion of the second transmission line, and a width of the third part of the second connection portion of the second transmission line is gradually decreased from the width of the second wiring portion of the second transmission line to a width of the fourth part of the second connection portion of the second transmission line.

5. The differential mode transmission line with the weak coupling structure according to claim 4, wherein a pitch between the first part of the first connection portion of the first transmission line and the first part of the first connection portion of the second transmission line is a fourth pitch, the fourth pitch is equal to the first pitch and less than the second pitch, a pitch between the second part of the first connection portion of the first transmission line and the second part of the first connection portion of the second transmission line is a fifth pitch, and the fifth pitch is gradually increased from the fourth pitch to the second pitch.

6. The differential mode transmission line with the weak coupling structure according to claim 5, wherein a pitch between the third part of the second connection portion of the first transmission line and the third part of the second connection portion of the second transmission line is a sixth pitch, the sixth pitch is gradually decreased from the second pitch to a seventh pitch, the seventh pitch is a pitch between the fourth part of the second connection portion of the first transmission line and the fourth part of the second connection portion of the second transmission line, and the seventh pitch is equal to the third pitch.

7. The differential mode transmission line with the weak coupling structure according to claim 6, wherein a length of the first transmission line is equal to a length of the second transmission line, a length of the first wiring portion of the first transmission line is less than a length of the second wiring portion of the second transmission line, a length of the second wiring portion of the first transmission line is equal to a length of the second wiring portion of the second transmission line, and a length of the third wiring portion of the first transmission line is equal to a length of the third wiring portion of the second transmission line.

8. The differential mode transmission line with the weak coupling structure according to claim 4, wherein the first part of the first connection portion of the first transmission line is parallel to the first part of the first connection portion of the second transmission line, and the fourth part of the second connection portion of the first transmission line is parallel to the fourth part of the second connection portion of the second transmission line.

9. The differential mode transmission line with the weak coupling structure according to claim 4, wherein a length of the first part of the first connection portion of the first transmission line is less than a length of the first part of the first connection portion of the second transmission line, and a length of the fourth part of the second connection portion of the first transmission line is greater than a length of the fourth part of the second connection portion of the second transmission line.

10. The differential mode transmission line with the weak coupling structure according to claim 4, wherein the first wiring portion of the first transmission line is parallel to the first wiring portion of the second transmission line, the second wiring portion of the first transmission line is parallel to the second wiring portion of the second transmission line, and the third wiring portion of the first transmission line is parallel to the third wiring portion of the second transmission line.

11. The differential mode transmission line with the weak coupling structure according to claim 4, wherein a first angle is formed between the first part of the first connection portion of the first transmission line and the first wiring portion of the first transmission line, a second angle is formed between the fourth part of the first transmission line and the third wiring portion of the first transmission line, a third angle is formed between the first part of the first connection portion of the second transmission line and the first wiring portion of the second transmission line, and a fourth angle is formed between the fourth part of the second transmission line and the third wiring portion of the second transmission.

* * * * *